United States Patent
Campbell

(10) Patent No.: US 12,224,717 B2
(45) Date of Patent: Feb. 11, 2025

(54) DISTRIBUTED BIAS CIRCUIT FOR WIDEBAND AMPLIFIERS

(71) Applicant: Qorvo US, Inc., Greensboro, NC (US)

(72) Inventor: Charles Forrest Campbell, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 532 days.

(21) Appl. No.: 17/689,469

(22) Filed: Mar. 8, 2022

(65) Prior Publication Data

US 2023/0291364 A1    Sep. 14, 2023

(51) Int. Cl.
| | |
|---|---|
| H03F 1/42 | (2006.01) |
| H03F 3/195 | (2006.01) |
| H03F 3/60 | (2006.01) |

(52) U.S. Cl.
CPC .............. *H03F 1/42* (2013.01); *H03F 3/195* (2013.01); *H03F 2200/36* (2013.01); *H03F 2200/451* (2013.01)

(58) Field of Classification Search
CPC ........ H03F 1/42; H03F 3/195; H03F 2200/36; H03F 2200/451; H03F 3/605; H03F 1/0211; H03F 1/565
USPC ........................................ 330/307, 286, 302
See application file for complete search history.

(56) References Cited

U.S. PATENT DOCUMENTS

| | | | |
|---|---|---|---|
| 6,377,125 B1* | 4/2002 | Pavio | H03F 3/607 330/296 |
| 9,673,759 B1* | 6/2017 | Fletcher | H03F 3/193 |
| 2016/0099690 A1* | 4/2016 | Kuwata | H03F 3/605 330/295 |

OTHER PUBLICATIONS

Campbell, C. et al., "A Wideband Power Amplifier MMIC Utilizing GaN on SiC HEMT Technology," IEEE Journal of Solid-State Circuits, vol. 44, No. 10, Oct. 2009, IEEE, pp. 2640-2647.
CoilCraft, "Broadband Conical Inductors," Document 334L-1, Dec. 10, 2021, https://www.coilcraft.com/en-us/products/rf/conical-broadband/0-40-ghz/bcl/bcl-221/, 3 pages.
Qorvo, "TGA2237-SM: 0.03-2.5 GHz 10 W GaN Power Amplifier," Data Sheet Rev. E, Apr. 2022, https://www.qorvo.com/products/p/TGA2237-SM, 18 pages.

* cited by examiner

Primary Examiner — Hieu P Nguyen
(74) Attorney, Agent, or Firm — Withrow & Terranova, P.L.L.C.

(57) ABSTRACT

Embedded blocking capacitor structures for wideband amplifier circuits are disclosed. A wideband amplifier circuit includes transistors that output radio frequency (RF) signals. An embedded blocking capacitor structure is operably connected between the terminals of the transistors and an RF output. The embedded blocking capacitor structure distributes a bias voltage to the terminals of the transistors and blocks the bias voltage from passing to the RF output. The embedded blocking capacitor structure also propagates an RF signal to an RF output.

20 Claims, 8 Drawing Sheets

DISTRIBUTED BIAS CIRCUIT FOR WIDEBAND AMPLIFIERS

FIELD OF THE DISCLOSURE

The present disclosure relates to amplifier biasing and, more particularly, to distributed biasing circuits for wideband amplifiers.

BACKGROUND

Wideband amplifier circuits are used in a variety of applications, including broadband radio, test equipment, and electronic warfare. Wideband amplifier circuits support a wide range of frequencies at a radio frequency (RF) output. For example, wideband amplifier circuits can operate within a range of tens of megahertz (MHz) to tens of gigahertz (GHz) frequencies.

Wideband amplifier circuits typically have a choke circuit connected between a direct current (DC) bias power source and the terminals of the transistors that receive a DC voltage from the DC bias power source. The choke circuit suppresses or "chokes" RF signals, particularly high frequency RF signals, while allowing the DC voltage to pass. However, in some instances, the connection point between the choke circuit and the transistor terminals is an RF active region in that the RF signal passes through the connection point. This RF activity can result in power loss or dissipation of the RF signal at the output of the amplifier circuit due to the heat that is generated as the RF signal passes over the connection point.

Another challenge with wideband amplifier circuits is the blocking capacitor connected to the output of the amplifier circuit. The blocking capacitor suppresses or "blocks" DC signals and passes RF signals to the output. A blocking capacitor can be integrated on the die of the wideband amplifier circuit (an on-chip blocking capacitor), but the on-chip blocking capacitor increases the cost of a wideband amplifier circuit and/or consumes an undesirable amount of area on the die.

SUMMARY

Embodiments disclosed herein provide an embedded blocking capacitor structure that is distributed and integrated in wideband amplifier integrated circuits. An embedded blocking capacitor structure distributes a bias voltage to terminals of the transistors that are operably connected to the embedded blocking capacitor structure and propagates a radio frequency (RF) signal to an RF output. The embedded blocking capacitor structure also blocks the bias voltage (e.g., a direct current (DC) bias voltage) from passing to the RF output.

In one aspect, an amplifier system includes wideband amplifier circuitry that has one or more transistors in an output stage of an amplifier circuit. Signal lines are operably connected to terminals of the transistors. The signal lines are used in an embedded blocking capacitor structure that operably connects the terminals of the transistors to an RF output. In one embodiment, the one or more transistors are field-effect transistors (FETs), the signal lines are microstrip signal lines that are operably connected to the drain terminals of the FETs, and the embedded blocking capacitor structure forms at least one metal-insulator-metal capacitor. A first microstrip signal line in the embedded blocking capacitor structure is configured to provide a bias voltage, such as a DC bias voltage, to the one or more FETs. A second microstrip signal line in the embedded blocking capacitor structure is configured to propagate an RF signal to the RF output.

In another aspect, a wideband amplifier integrated circuit includes a transistor that is in amplifier circuitry and an embedded blocking capacitor structure that operably connects a terminal of the transistor to an RF output. The embedded blocking capacitor structure includes at least one blocking capacitor having a top conductive plate that is configured as a first signal line to provide a bias voltage and a bottom conductive plate that is configured to transmit an RF signal to the RF output.

In yet another aspect, a method of providing a wideband amplifier system includes providing amplifier circuitry and an embedded blocking capacitor structure in an integrated circuit. The amplifier circuitry includes a transistor and the embedded blocking capacitor structure operably connects a terminal of the transistor to an RF output. The embedded blocking capacitor structure includes a DC blocking capacitor having a first conductive plate configured as a first signal line and a second conductive plate configured as a second signal line. In a non-limiting nonexclusive embodiment, the first conductive plate is the top conductive plate and the second conductive plate is the bottom conductive plate of the embedded blocking capacitor structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
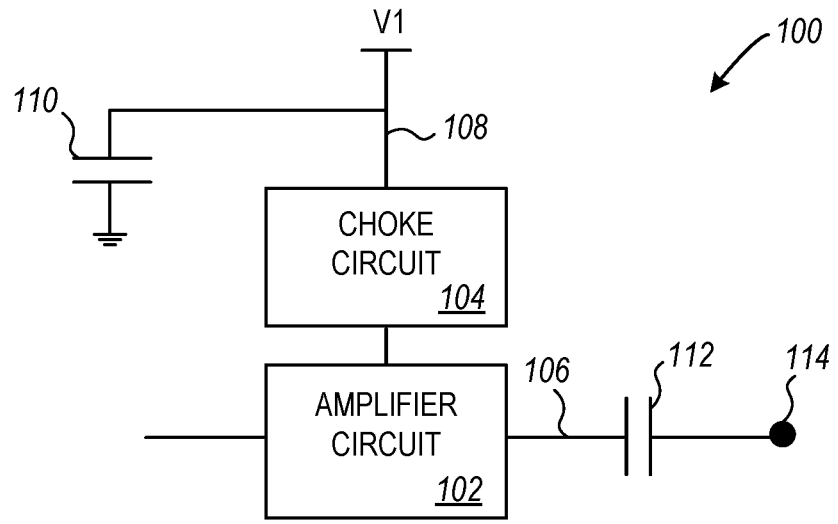
FIG. 1 illustrates a block diagram of a first amplifier system that includes a discrete blocking capacitor connected to an output of a wideband amplifier circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments disclosed herein provide embedded blocking capacitor structures for wideband amplifier circuits. A wideband amplifier circuit includes transistors that output radio frequency (RF) signals, and an embedded blocking capacitor structure is operably connected between terminals of the transistors and an RF output. The embedded blocking capacitor structure distributes a bias voltage to the terminals of the transistors and blocks the bias voltage from passing to the RF output. The embedded blocking capacitor structure also propagates an RF signal to the RF output.

In one embodiment, the embedded blocking capacitor structure is a single continuous blocking capacitor having a top conductive plate and a bottom conductive plate. The top conductive plate is configured as a first signal line that provides the bias voltage to the terminals of the transistors and the bottom conductive plate is configured as a second signal line that propagates the RF signal to the RF output. For example, the embedded blocking capacitor structure can be implemented as a single continuous metal-insulator-metal (MIM) capacitor.

In another embodiment, the embedded blocking capacitor structure includes two or more blocking capacitors that electrically share a top conductive plate and a bottom conductive plate. The shared top conductive plate is configured as a first signal line that provides the bias voltage to the terminals of the transistors and the common bottom conductive plate is configured as a second signal line that propagates the RF signal to the RF output.

FIG. 1 illustrates a block diagram of a first amplifier system 100 that includes a discrete blocking capacitor 112 connected to an output of an amplifier circuit 102. In a non-limiting nonexclusive example, the amplifier circuit 102 is a power amplifier circuit that is included in a monolithic microwave integrated circuit (MMIC). The amplifier system 100 includes the amplifier circuit 102 and a choke circuit 104. The choke circuit 104 is operably connected to an output signal line or an output bond pad of the amplifier circuit 102. The output signal line or output bond pad operably connects to a signal line 106.

The choke circuit 104 is also operably connected to a power supply (V1) via a signal line 108. In the illustrated embodiment, V1 is a direct current (DC) power supply. The choke circuit 104 is operable to block or reduce alternating current signals, such as RF current signals, from leaving the amplifier circuit 102 and entering the choke circuit 104 while passing or transmitting the DC bias signals to the amplifier circuit 102. Any suitable choke circuit may be used. In one non-limiting nonexclusive example, the choke circuit 104 is an inductor that is formed in the integrated circuit that includes the amplifier circuit 102 (e.g., an on-chip planar inductor). In another example, the choke circuit 104 is a discrete external inductor that is operably connected to the output of the amplifier circuit 102 (e.g., an off-chip inductor).

A bypass capacitor 110 is operably connected between V1 and ground. The bypass capacitor 110 reduces or prevents noise or voltage spikes on the signal line 108.

A discrete blocking capacitor 112 (e.g., an off-chip blocking capacitor) is operably connected between the output of the amplifier circuit 102 and an output node 114. The blocking capacitor 112 is operable to pass amplified RF current signals to the output node 114 while reducing or blocking the DC current signals from propagating to the output node 114.

In some instances, such as when the amplifier system 100 is used in a MMIC and the amplifier circuit 102 is a gallium nitride (GaN) amplifier circuit, the bias voltage for the transistors in the amplifier circuit 102 can range between twenty to fifty volts. Unfortunately, many discrete blocking capacitors 112 that can operate at these voltage levels typically do not have good RF performance above a few gigahertz (GHz). Moreover, existing wideband high frequency blocking capacitors 112 have maximum working voltages of sixteen volts or less and generally cannot be used with high power GaN amplifier circuits.

Figure 2:
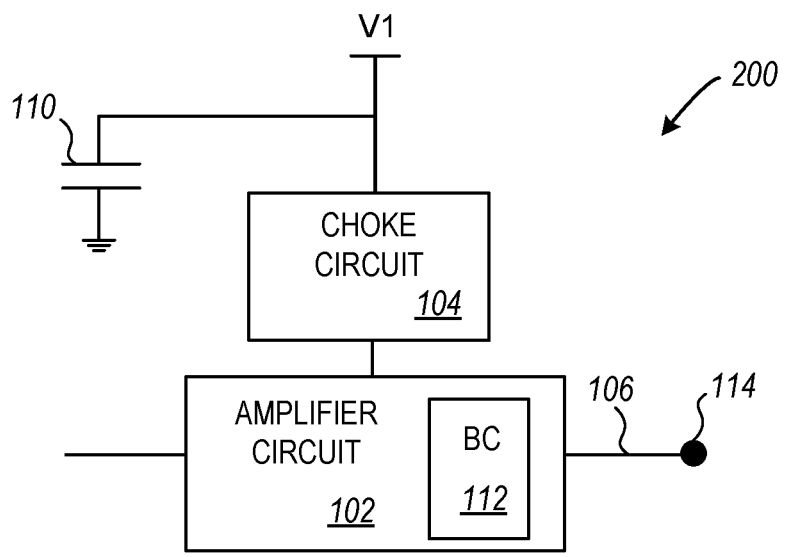
FIG. 2 illustrates a block diagram of a second amplifier system that has a blocking capacitor integrated with the wideband amplifier circuit.

FIG. 2 illustrates a block diagram of a second amplifier system 200 that has a blocking capacitor 112 integrated with the amplifier circuit 102. The amplifier system 200 is similar to the amplifier system 100 shown in FIG. 1 in that the choke circuit 104 is operably connected between the amplifier circuit 102 and V1. The bypass capacitor 110 is operably connected between V1 and ground. However, unlike the amplifier system 100, the blocking capacitor 112 is integrated in the integrated circuit that includes the amplifier circuit 102 (e.g., an on-chip blocking capacitor). The choke circuit 104, the output signal line of the amplifier circuit 102, and the blocking capacitor 112 are all operably connected to a common node (not shown) in the integrated circuit, with the blocking capacitor 112 operably connected between the common node (not shown) and the signal line 106. Thus, the entire integrated blocking capacitor 112 is located at the output of the amplifier circuit 102.

In some instances, integrating the blocking capacitor 112 in the integrated circuit with the amplifier circuit 102 results in an increase in the size of the die area of the integrated circuit. The larger die area can increase the cost of the integrated circuit and/or increase the complexity of fabricating the integrated circuit. Additionally or alternatively, the integrated blocking capacitor 112 may increase the microwave frequency loss of the output stage of the amplifier circuit 102.

Figure 3:
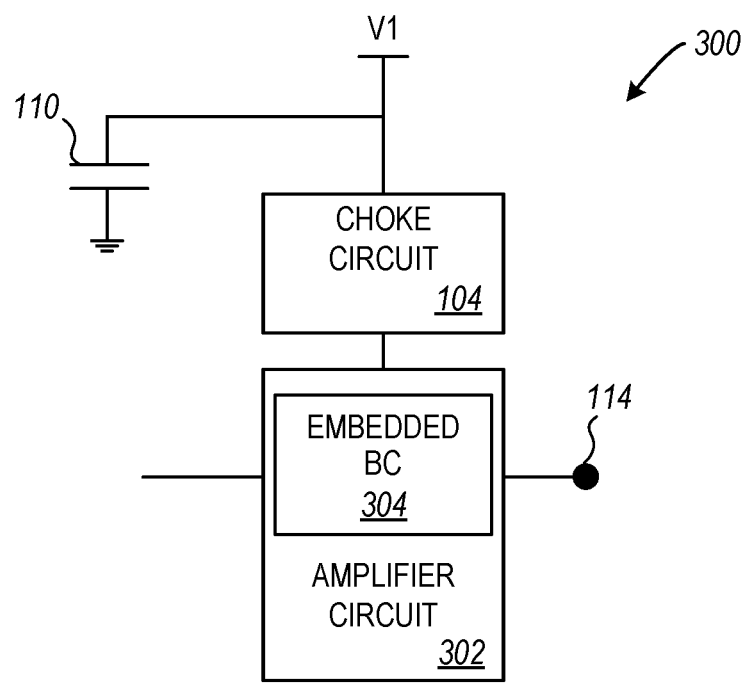
FIG. 3 illustrates a block diagram of a third amplifier system that includes an embedded blocking capacitor integrated into signal lines in the wideband amplifier circuit.

FIG. 3 illustrates a block diagram of a third amplifier system 300 that includes an embedded blocking capacitor (BC) structure 304 integrated into signal lines in an amplifier circuit 302. The amplifier system 300 includes the choke circuit 104 operably connected to V1. The bypass capacitor 110 is operably connected between V1 and ground. The choke circuit 104 is also operably connected to the amplifier circuit 302 with the embedded BC structure 304.

The embedded BC structure 304 is integrated into the signal lines that connect the terminals of the transistors of the amplifier circuit 302 to the output node 114. In one embodiment, the embedded BC structure 304 is integrated into microstrip signal lines that connect the drain terminals ("microstrip drain lines") of the transistors in an output stage of the amplifier circuit 302 to the output node 114. The embedded BC structure 304 is distributed along the microstrip drain lines and can form a single high voltage MIM capacitor. In a non-limiting example, the output stage is a notational non-uniform distributed power amplifier (NDPA) output stage that is operably connected to the output node 114.

Since the embedded BC structure 304 is integrated into, and distributed along, the drain lines, the shape of the embedded BC structure 304 matches the shape of the microstrip drain lines. Accordingly, the embedded BC structure 304 does not consume any additional die area of the integrated circuit that includes the amplifier circuit 302.

As will be described in more detail later, the embedded BC structure 304 has little to no impact on the RF performance of the amplifier circuit 302.

Nearly all of the RF energy is output from the amplifier circuit 302. The connection point of the choke circuit 104 to the embedded BC structure 304 in the amplifier circuit 302 is a less RF active region, which can improve the performance of the amplifier circuit 302.

Figure 4:
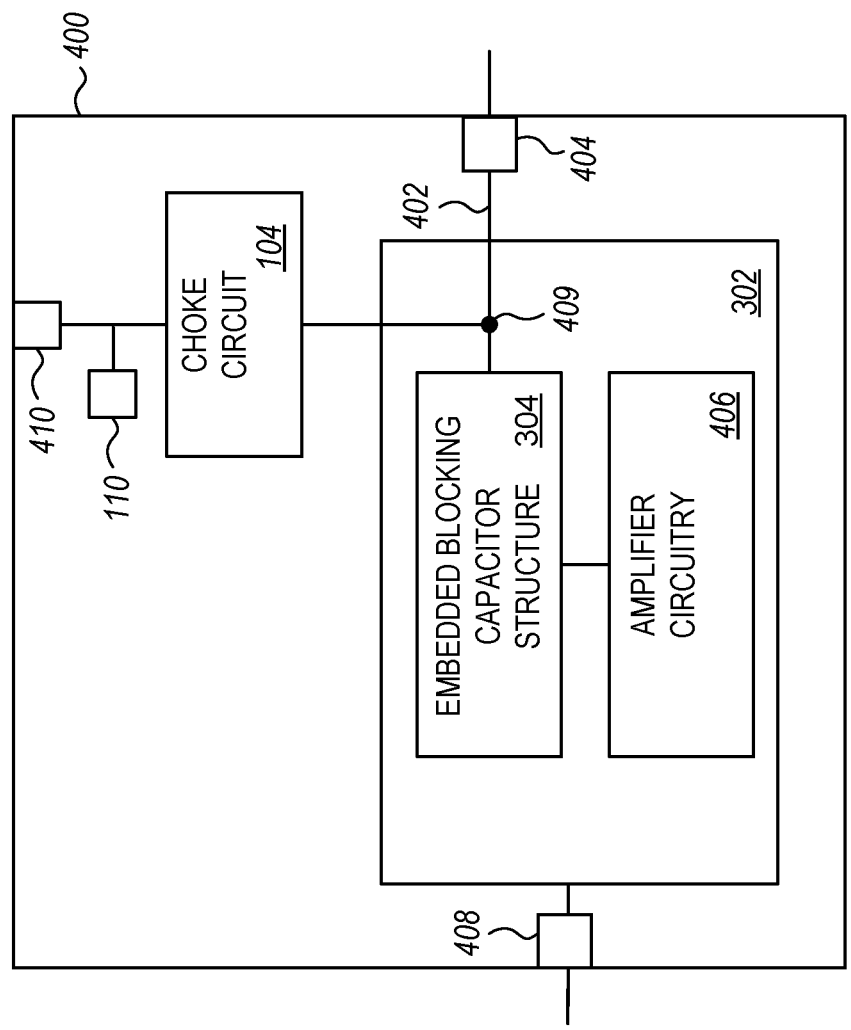
FIG. 4 illustrates a block diagram of an example circuit board that includes the amplifier system shown in FIG. 3.

FIG. 4 illustrates a block diagram of an example integrated circuit 400 that includes the amplifier system shown in FIG. 3. The amplifier circuit 302 and the choke circuit 104 are disposed in the integrated circuit 400. In other embodiments, the choke circuit 104 is an off-chip choke circuit that is not in the integrated circuit 400 but is operably connected to the output of the embedded BC structure 304 or to a signal line 402 that is connected to an output bond pad 404 of the integrated circuit 400.

The amplifier circuit 302 includes the embedded BC structure 304 operably connected to amplifier circuitry 406. An RF signal is received by the amplifier circuit 302 via an input bond pad 408 and an amplified RF signal is output from the embedded BC structure 304 to the output bond pad 404. The embedded BC structure 304, the choke circuit 104, and the signal line 402 that is connected to the output bond pad 404 are all operably connected to common node 409.

The amplifier circuitry 406 includes the electrical circuits and components that amplify the RF signal, including transistors that output RF signals in an output stage of the amplifier circuitry 406. The transistors in the output stage are operably connected to the embedded BC structure 304. In particular, the embedded BC structure 304 is operably connected to a terminal of each transistor. In one embodiment, the transistors are implemented as field-effect transistors (FETs) and the terminals are the drain terminals. The drain terminals of the transistors are operably connected to microstrip signal lines (e.g., microstrip drain lines) that are part of the embedded BC structure 304. Example embodiments of the embedded BC structure 304 are described in more detail in conjunction with FIGS. 5-8.

A DC power source 410 is operably connected to the choke circuit 104. In one embodiment, the DC power source 410 is implemented as a bond pad that is operably connected to an off-chip DC power supply (e.g., V1 in FIG. 3). The DC power source 410 provides biasing signals to the amplifier circuitry 406 (e.g., to the drain terminals of the FETs).

Figure 5:
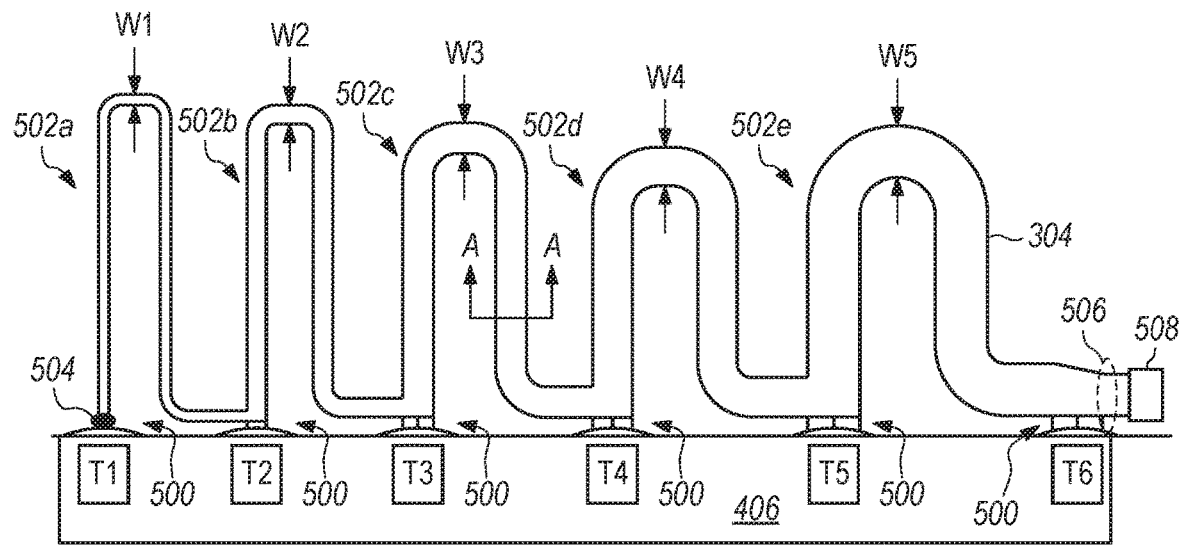
FIG. 5 illustrates an example of an implementation of the embedded blocking capacitor structure shown in FIGS. 3 and 4.

FIG. 5 illustrates an example of an implementation of the embedded BC structure 304 shown in FIGS. 3 and 4. Transistors T1, T2, T3, T4, T5, T6 in the amplifier circuitry 406 are operably connected to the embedded BC structure 304 via connectors 500. In one embodiment, the connectors 500 are implemented as airbridges and the transistors T1-T6 as FETs. Although FIG. 5 depicts five microstrip drain lines 502a-502e and six transistors T1-T6, other embodiments are not limited to this configuration. Embodiments can include any suitable numbers of microstrip drain lines and transistors.

Each terminal of the transistors T1-T6 that is operably connected to the embedded BC structure 304 receives a bias voltage (e.g., a DC bias voltage) from the embedded BC structure 304 and provides an RF signal to the embedded BC structure 304. The terminal of the first transistor (e.g., transistor T1) that is operably connected to the embedded BC structure 304 is connected at a starting node 504 of the embedded BC structure 304. The terminal of the last transistor (e.g., transistor T6) that is operably connected to the embedded BC structure 304 is connected at an RF output 506. Thus, the embedded BC structure 304 is operably connected to and distributed along the transistors T1-T6 between the starting node 504 to the RF output 506.

The RF output 506 is operably connected to an output of the amplifier circuit (e.g., to a bond pad 508). The bond pad 508 is operably connected to the output bond pad 404 in FIG. 4. As will be described in more detail in conjunction with FIG. 8, an on-chip choke circuit or an off-chip choke circuit is operably connected at or near the RF output 506 (e.g., at or near the common node 409 in FIG. 4).

As described earlier, the transistors T1-T6 can be FETs with the drain terminals of the FETs operably connected to the embedded BC structure 304, and the microstrip drain lines 502a, 502b, 502c, 502d, 502e that are disposed between the starting node 504 and the RF output 506 are part of the embedded BC structure 304. In one embodiment, the microstrip drain lines 502a, 502b, 502c, 502d, 502e form a single continuous high voltage MIM capacitor that operably connects the drain terminals of the transistors T1-T6 to the RF output 506.

In the illustrated embodiment, widths W1, W2, W3, W4, W5 of the microstrip drain lines 502a, 502b, 502c, 502d, 502e, respectively, vary between the starting node 504 and the RF output 506. The varying widths W1, W2, W3, W4, W5 vary the impedance and the capacitance of the embedded BC structure 304. In FIG. 5, W1, W2, W3, W4, W5 increase as the embedded BC structure 304 moves from the starting node 504 to the RF output 506. In other words, W1<W2<W3<W4<W5. In another embodiment, at least one width of a microstrip drain line varies from the widths of the remaining microstrip drain lines. For example, W1<W2<W3, W4=W3, and W4<W5, or W1=W2, W2<W3, W4=W3, W4<W5. In yet another embodiment, the widths W1, W2, W3, W4, W5 are substantially equal.

In some embodiments, the capacitance of the embedded BC structure 304 is less than the capacitance of a conventional blocking capacitor (e.g., blocking capacitor 112 in FIGS. 1 and 2). This can be particularly true in embodiments that operate at lower frequency levels. The degree to which a series capacitor approximates an RF short between the top and the bottom conductive plates is a function of the impedance level the capacitor is embedded within. The higher the embedding impedance, the lower the capacitance that is required to pass a given percent of the RF signal.

Generally, the embedding impedance of an NDPA is lowest at the amplifier output (e.g., RF output 506 in FIG. 5). Positioning a blocking capacitor at the output, as shown in FIGS. 1 and 2, can require the blocking capacitor to have a higher capacitance compared to the capacitance of the embedded BC structure 304, which distributes the capacitance over regions with higher embedding impedances. The impedance levels along the drain lines of an NDPA may be approximated using Equation (1).

$$Z_{o,n} = \frac{R_P(\Omega \cdot mm)}{\sum_{j=1}^{n} W_{Q,n}},$$ Equation (1)

where $R_P$ represents the real part of the normalized transistor load target and $W_{Q,n}$ represents the periphery of nth transistor. When n=1, the transistor operably connected to the embedded BC structure 304 on the far left is the nth transistor. The load target is generally considered constant fixed determined by power supply voltage, meaning that the embedding impedance seen by each transistor (e.g., transistors T1-T6) decreases as you move toward the RF output 506. This implies that at each transistor connection to the embedded BC structure 304, less capacitance is required due to the higher embedding impedance. Accordingly, the total amount of capacitance of the embedded BC structure 304 can be less compared to the capacitance of a discrete blocking capacitor (e.g., blocking capacitor 112 in FIGS. 1 and 2).

Figure 6:
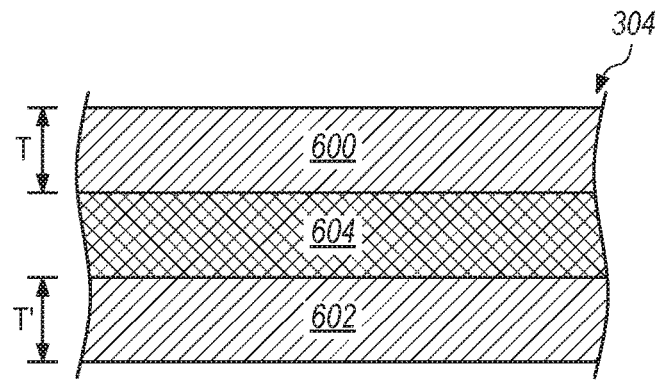
FIG. 6 illustrates a first cross-section of the embedded blocking capacitor shown in FIG. 5 taken along line A-A.

FIG. 6 illustrates a first cross-section of the embedded BC structure 304 shown in FIG. 5 taken along line A-A. The microstrip drain lines (e.g., 502a, 502b, 502c, 502d, 502e in FIG. 5) are constructed with a top conductive plate 600 and a bottom conductive plate 602. The top conductive plate 600 and the bottom conductive plate 602 are each common (e.g., a single continuous conductive plate) throughout the entire length of the embedded BC structure 304. The top and bottom conductive plates 600, 602 can be formed with any suitable conductive material. One non-limiting nonexclusive example of a conductive material is a metal. A dielectric material 604 is disposed between the top and the bottom conductive plates 600, 602. Accordingly, the microstrip drain lines form a single continuous capacitor, such as a MIM capacitor.

In one embodiment, the thickness of the conductive plate that provides the bias voltage to the terminals of the transistors operably connected to the embedded BC structure 304 (e.g., transistors T1-T6 in FIG. 5) is greater than the thickness of the conductive plate that propagates an RF signal to the RF output 506. As discussed earlier, in some wideband amplifier circuits, such as GaN amplifier circuits, the DC bias voltage can range from twenty to fifty volts. Accordingly, the thick conductive plate enables the conductive plate to transmit the high bias signal. Because the signal level of the RF signal is less than the signal level of the DC bias signal, the thickness of the conductive plate that propagates the RF signal can be thinner compared to the thickness of the conductive plate that provides the DC bias signal. For example, in one embodiment, the thickness (T) of the top conductive plate 600 is greater than the thickness (T') of the bottom conductive plate 602 when the top conductive plate 600 provides the bias signal and the bottom conductive plate 602 transmits the RF signal.

Figure 7:
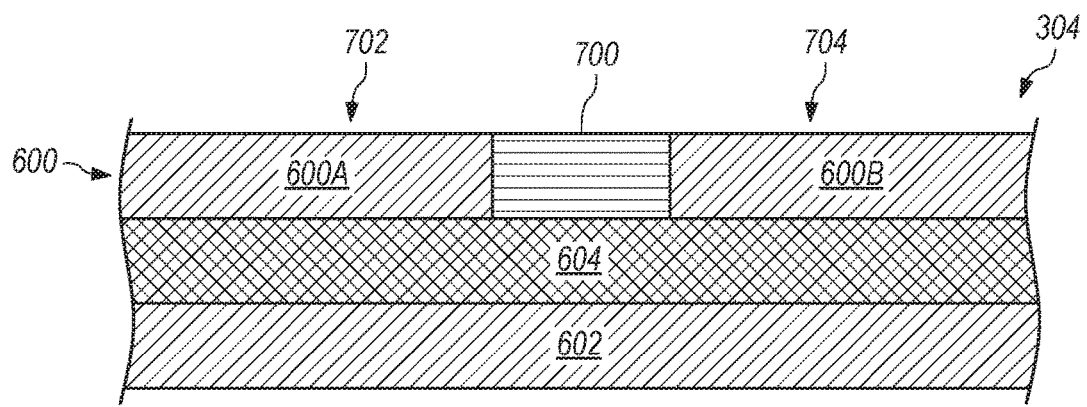
FIG. 7 illustrates a second cross-section of the embedded blocking capacitor structure shown in FIG. 5 taken along line A-A.

FIG. 7 illustrates a second cross-section of the embedded BC structure 304 shown in FIG. 5 taken along line A-A. In this embodiment, two or more blocking capacitors are integrated into the microstrip drain lines. The top conductive plate 600 is interrupted and divided into two or more conductive segments, and an electrical connector, such as an airbridge, electrically connects adjacent conductive segments together. For example, as shown in FIG. 7, the top conductive plate 600 is divided into conductive segments 600A, 600B and an electrical connector 700 (e.g., an airbridge) electrically connects the conductive segment 600A to the conductive segment 600B. The dielectric material 604 is positioned between the bottom conductive plate 602 and the conductive segments 600A, 600B and the electrical connector 700 in the top conductive plate 600.

The dielectric material 604 and the bottom conductive plate 602 are continuous and shared by, or common to blocking capacitors 702, 704. A blocking capacitor is formed at locations where the conductive segments 600A, 600B are located. In FIG. 7, two blocking capacitors 702, 704 are formed by the conductive segments 600A, 600B, the dielectric layer 604, and the bottom conductive plate 602. Although two blocking capacitors 702, 704 are shown in FIG. 7, other embodiments can include any number of blocking capacitors in the embedded BC structure 304. The blocking capacitors 702, 704 are connected in parallel based on the electrically connected conductive segments 600A, 600B in the top conductive plate 600 and the common bottom conductive plate 602. Thus, the embedded BC structure 304 provides multiple blocking capacitors (e.g., MIM capacitors) that are connected in parallel and distributed between the starting node 504 and the RF output 506.

Figure 8:
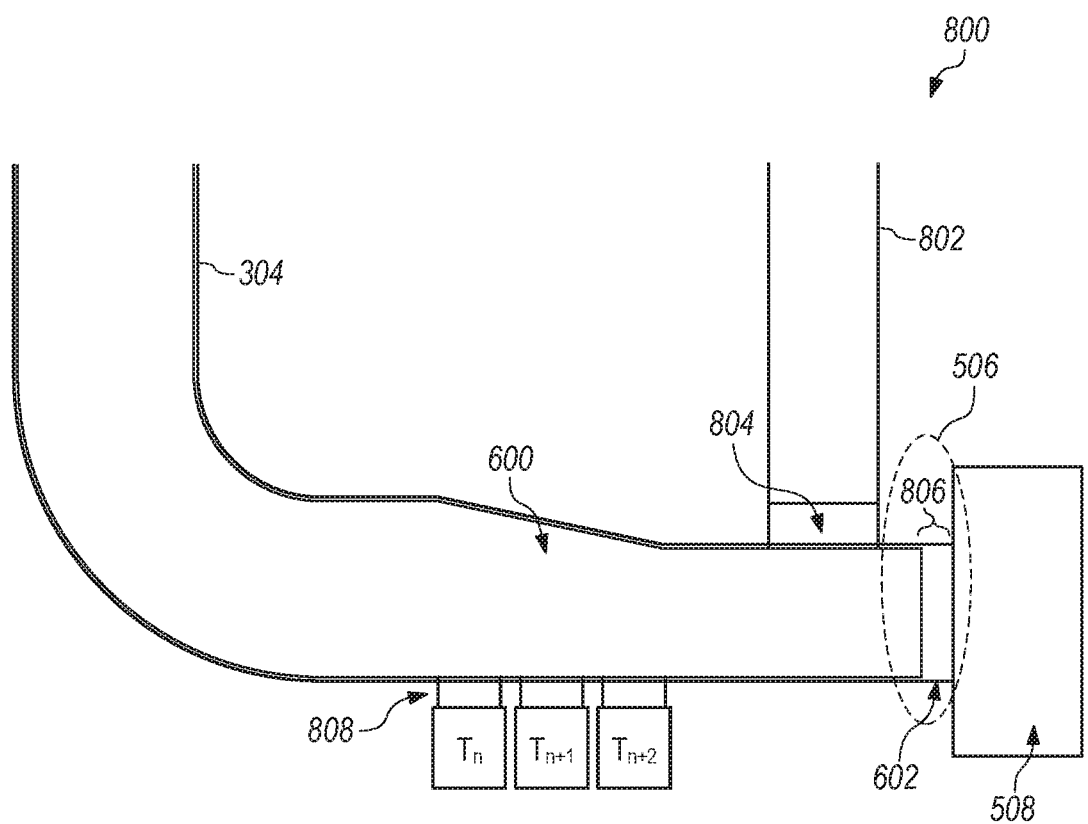
FIG. 8 illustrates an example output stage of a wideband amplifier circuit that includes an embedded blocking capacitor structure.

FIG. 8 illustrates an example output stage of an amplifier circuit 800 that includes the embedded BC structure 304. The example output stage 800 includes a conductive line 802 from or in the choke circuit operably connected to the top conductive plate 600 of the embedded BC structure 304. In one embodiment, an airbridge 804 is used to connect the conductive line 802 to the top conductive plate 600 near the RF output 506. Additionally, the top conductive plate 600 is not operably connected to an output of the amplifier circuit (e.g., the bond pad 508 in FIG. 5) as shown by a gap 806 between the top conductive plate 600 and the bond pad 508. Thus, the top conductive plate 600 is operably connected to the choke circuit and not to the output of the amplifier circuit.

The top conductive plate 600 is also operably connected to the transistors Tn, Tn+1, Tn+2 in the amplifier circuitry via airbridges 808 (n>0). Although FIG. 8 shows only three transistors Tn, Tn+1, Tn+2, other embodiments can have any suitable number of transistors operably connected to the top conductive plate 600.

The bottom conductive plate 602 of the embedded BC structure 304 is operably connected to the output of the amplifier circuit (e.g., the bond pad 508). In the example embodiment, the RF output 506 is the portion of the bottom conductive plate 602 that connects to the output of the amplifier circuit. The RF output 506 is the portion of the bottom conductive plate 602 where the top conductive plate 600 is not positioned over or overlying the bottom conductive plate 602 (e.g., the bottom conductive plate 602 in the gap 806).

A bias voltage, such as a DC bias voltage, is output from the choke circuit on the conductive line 802 and is provided on the top conductive plate 600 of the embedded BC structure 304. The RF signals from the transistors Tn, Tn+1, Tn+2 are initially injected onto the top conductive plate 600 but transition to the bottom conductive plate 602 as the RF signals propagate along the embedded BC 304 structure toward the bond pad 508. In this manner, only the RF signals (or substantially RF signals) are output from the amplifier circuit.

Advantageously, the embedded BC structure 304 does not consume additional die area in the integrated circuit since the top and bottom conductive plates 600, 602 can have the same width and length as conventional microstrip drain lines. Additionally, substantially all of the RF signals are propagating on the bottom conductive plate 602 when the RF signals reach the bond pad 508.

Accordingly, the embedded BC structure 304 can have a negligible impact on the RF performance of the amplifier circuit. Moreover, since the bottom conductive plate 602 is not in direct contact with the airbridge 804, the connection between the choke circuit (e.g., conductive line 802) and the top conductive plate 600 should be a less RF active region, which may improve the performance of the amplifier circuit.

Figure 9:
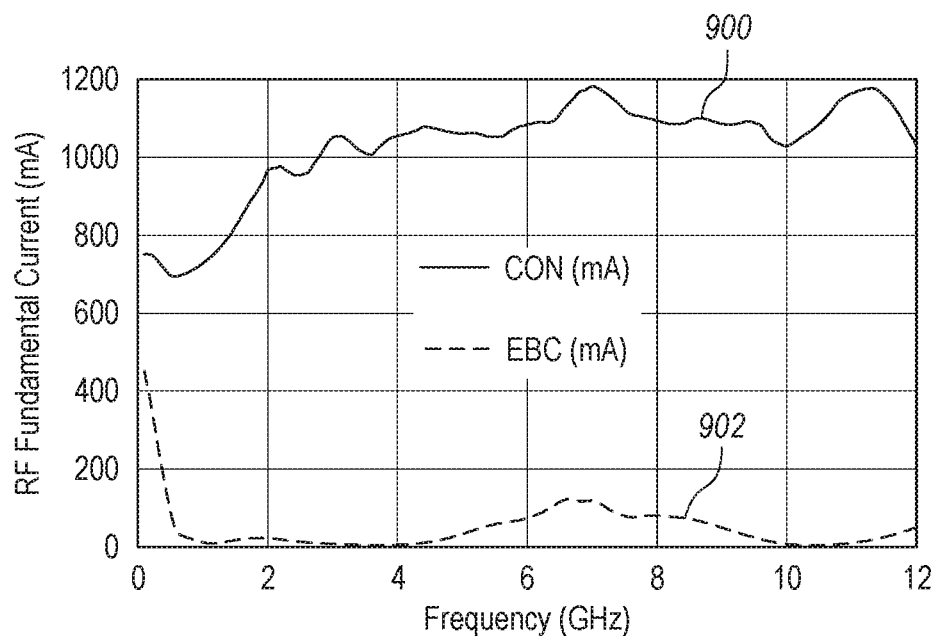
FIG. 9 illustrates a graph of simulations of the radio frequency (RF) current across the connection point between the choke circuit and a discrete blocking capacitor and the RF current across the connection point between the choke circuit and an embedded blocking capacitor structure.

FIG. 9 illustrates a graph of simulations of the RF current across the connection point between the choke circuit and a discrete blocking capacitor and the RF current across the connection point between the choke circuit and an embedded BC structure. The vertical axis represents the RF current in milliamps (mA) and the horizontal axis represents the frequency of the RF current in GHz. In the representative graph, the frequency ranges from one tenth (0.1) to twelve (12) GHz.

Plot 900 shows the RF current in mA in a conventional amplifier circuit (CON) that is connected to a discrete blocking capacitor (e.g., discrete blocking capacitor 112 in FIGS. 1 and 2). As shown, the RF current in the conventional amplifier circuit at the connection point ranges from a low of approximately seven hundred (700) mA at one tenth (0.1) GHz, a high of nearly twelve hundred (1200) mA at approximately seven hundred (700) and eleven hundred (1100) GHz, to approximately one thousand (1000) mA at twelve (12) GHz.

Plot 902 depicts the RF current in an amplifier circuit with an embedded BC structure (EBC) (e.g., embedded BC structure 304 in FIGS. 3-7). Unlike the conventional amplifier circuit, the RF current at the connection point in the amplifier circuit with the embedded BC structure ranges from a high of approximately five hundred (500) mA at one tenth (0.1) GHz, approximately one hundred (100) mA at seven hundred (700) GHz, nearly zero (0) at eleven hundred (1100) GHz, to approximately fifty (50) mA at 12 GHz. This reduced power dissipation is due at least in part to the connection point at the embedded BC structure being a considerably less RF active region across the entire representative frequency spectrum compared to the connection point in a conventional amplifier circuit. The reduced RF activity can improve the RF performance of the amplifier circuit and/or increase the reliability of the amplifier circuit.

Figure 10:
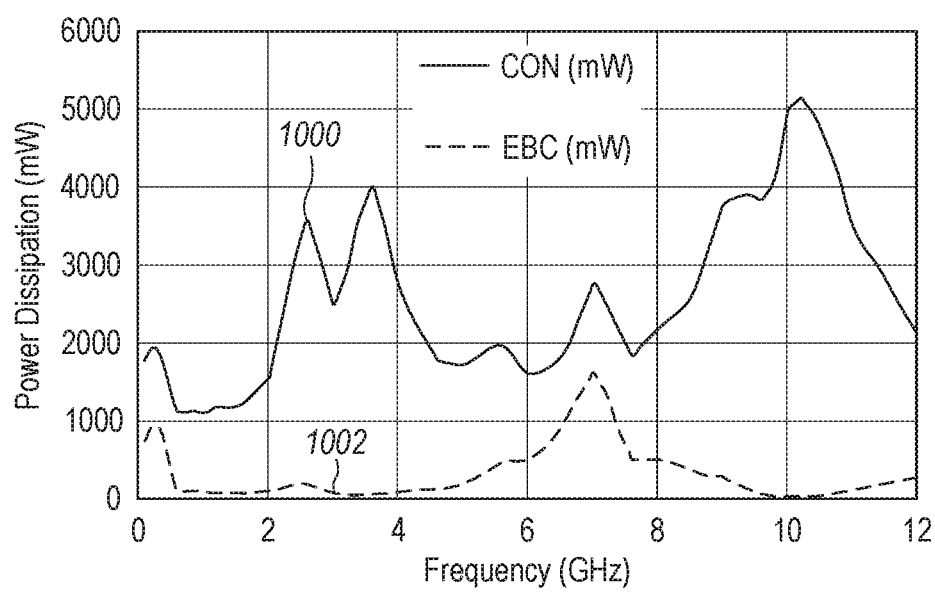
FIG. 10 illustrates a graph of simulations of the RF power dissipation in a choke circuit operably connected to a discrete blocking capacitor and the RF power dissipation in a choke circuit operably connected to an embedded blocking capacitor structure.

FIG. 10 illustrates a graph of simulations of the RF power dissipation in a choke circuit operably connected to a discrete blocking capacitor (an off-chip blocking capacitor) and the RF power dissipation in a choke circuit operably connected to an embedded blocking capacitor structure. The vertical axis represents the total RF power dissipation in milliwatts (mW) and the horizontal axis represents the frequency (GHz). In the representative graph, the frequency ranges from one tenth (0.1) to twelve (12) GHz.

Plot 1000 shows the total RF power dissipation in the choke circuit operably connected to the conventional amplifier circuit (CON). As shown, the total RF power dissipation in the choke circuit in the conventional amplifier circuit ranges from approximately eighteen hundred (1800) mW at one tenth (0.1) GHz, approximately twenty-eight hundred (2800) mW at seven hundred GHz, a high of approximately five thousand (5000) mW at ten (10) GHz, to approximately two thousand (2000) mW at twelve (12) GHz.

Plot 1002 depicts the total RF power dissipation in the choke circuit operably connected to an embedded BC structure (EBC). Unlike the conventional amplifier circuit, the total RF power dissipation in the choke circuit ranges from approximately eight hundred (800) mW at one tenth (0.1) GHz, a high of approximately fifteen hundred (1500) mW at seven hundred GHz, approximately zero (0) mW at ten (10)

GHz, to approximately two hundred (200) mW at twelve (12) GHz. Thus, the choke circuit operably connected to the embedded BC structure dissipates a reduced amount of RF power across the entire example frequency spectrum compared to a conventional amplifier circuit.

The reduced total RF power dissipation may improve the RF performance of the amplifier circuit and/or increase the reliability of the amplifier circuit.

Figure 11:
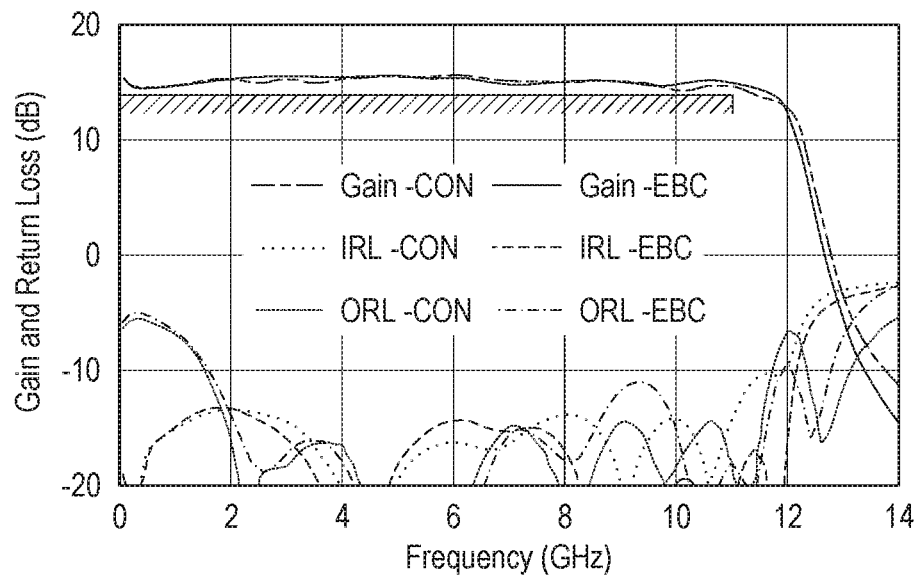
FIG. 11 illustrates a graph of simulations for gain, input return loss, and output return loss for a conventional amplifier circuit operably connected to a discrete blocking capacitor and for an amplifier circuit that includes an embedded blocking capacitor structure.

FIG. 11 illustrates a graph of simulations for gain, input return loss (IRL), and output return loss (ORL) for a conventional amplifier circuit operably connected to a discrete blocking capacitor and for an amplifier circuit that includes an embedded BC structure. Simulated results for the amplifier circuits are plotted for a thirty-one (31) decibels (dB) input power level. The vertical axis represents the gain and the return loss in dB and the horizontal axis represents the frequency (GHz). In the representative graph, the frequency ranges from one-tenth (0.1) to fourteen (14) GHz.

The graph shows the amount of effective DC blocking by the embedded BC structure is substantially equivalent to the DC blocking by a discrete blocking capacitor (e.g., discrete blocking capacitor 112 in FIGS. 1 and 2). The plots of the gain, the IRL, and the ORL are substantially equivalent across the frequency band of 0.1 to 14 GHz. For example, the signal gain is around 15 dB for both amplifier circuits between one-tenth (0.1) GHz and twelve (12) GHz. However, the gain variation in the amplifier circuit with the embedded BC structure is 1.11 dB compared to 1.31 dB for the conventional amplifier circuit with the discrete blocking capacitor.

Figure 12:
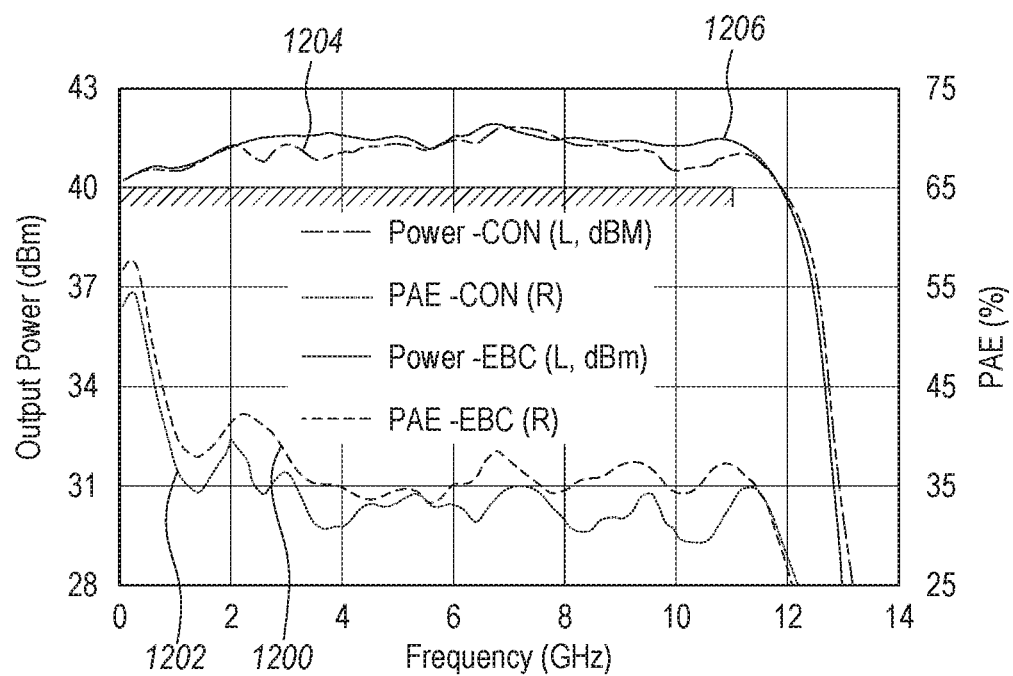
FIG. 12 illustrates a graph of simulations for output power and power-added efficiency for a conventional amplifier circuit operably connected to a discrete blocking capacitor and for an amplifier circuit that includes an embedded blocking capacitor structure.

FIG. 12 illustrates a graph of simulations for output power and power-added efficiency (PAE) for a conventional amplifier circuit operably connected to a discrete blocking capacitor and for an amplifier circuit that includes an embedded BC structure. PAE represents an overall efficiency of the power amplifier circuit, including the effect of the input power (e.g., the effect of the gain). PAE is typically expressed as a percent, In FIG. 12, the vertical axis represents the absolute output power in decibels (dBm) and the horizontal axis represents the frequency (GHz). Similar to FIG. 10, the frequency in the example graph ranges from one-tenth (0.1) to fourteen (14) GHz.

The plot 1200 shows the simulated PAE for the amplifier circuit with the embedded BC structure (EBC) while the plot 1202 depicts the simulated PAE for the amplifier circuit connected to the discrete blocking capacitor (CON). Plot 1200 shows the PAE is higher over the entire represented frequency band with several points of improvement at various frequencies. For example, at two (2) GHz the PAE for the amplifier circuit with the embedded BC structure is approximately forty-one (41) percent (plot 1200) while the PAE for the conventional amplifier circuit is approximately thirty-nine (39) percent (plot 1202).

Additionally, at approximately seven (7) GHz the PAE for the amplifier circuit with the embedded BC structure is approximately thirty-seven (37) percent (plot 1200) while the PAE for the conventional amplifier circuit is approximately thirty-five (35) percent (plot 1202). At nine (9) GHz, the PAE for the amplifier circuit with the embedded BC structure is approximately thirty-seven (37) percent (plot 1200) while the PAE for the conventional amplifier circuit is approximately thirty-two (32) percent (plot 1202). At eleven (11) GHz, the PAE for the amplifier circuit with the embedded BC structure is approximately thirty-six (36) percent (plot 1200) while the PAE for the conventional amplifier circuit is approximately thirty-four (34) percent (plot 1202).

Thus, the amplifier circuit with the embedded BC structure can provide approximately a two to four percent increase in the PAE, which is a significant improvement over the conventional amplifier circuit.

Plot 1204 depicts the absolute output power for the conventional amplifier circuit and plot 1206 depicts the absolute output power for the amplifier circuit with the embedded BC structure. Plot 1206 shows the absolute output power for the amplifier circuit with the embedded BC structure is higher over most of the frequency band compared to the absolute output power of the conventional amplifier circuit (plot 1204). At some frequencies, the absolute output power of the amplifier circuit with the embedded BC structure is as much as eight tenths (0.8) dB higher at some frequencies (e.g., 3.5 and 11 GHz).

Figure 13:
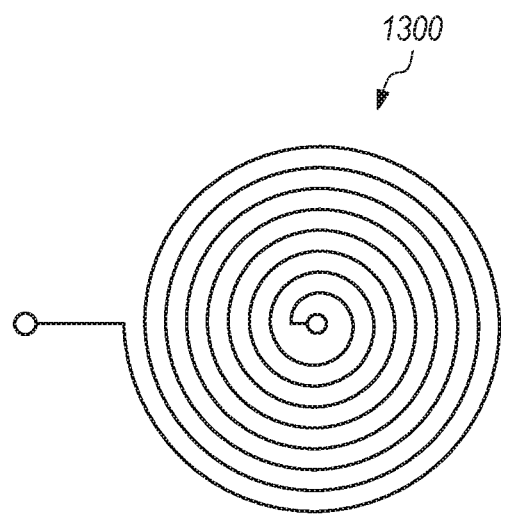
FIG. 13 illustrates an example of an on-chip inductor.

FIG. 13 illustrates an example of an on-chip inductor. A non-limiting nonexclusive example of the on-chip inductor is a planar inductor, such as a spiral planar inductor 1300.

Figure 14:
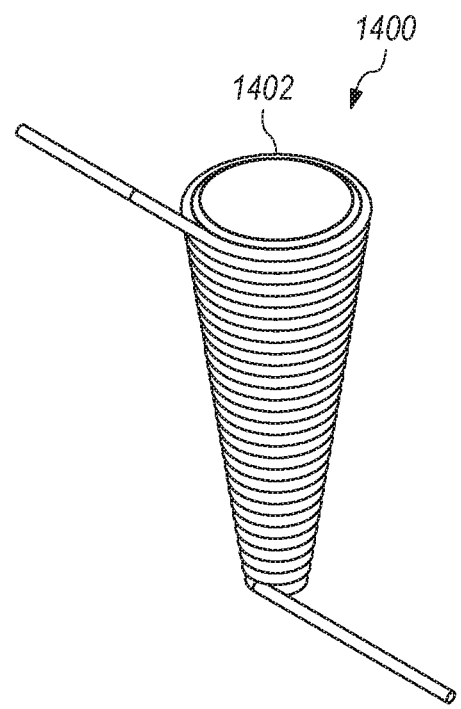
FIG. 14 illustrates an example of an off-chip inductor.

FIG. 14 illustrates an example of an off-chip inductor. A non-limiting nonexclusive example of an off-chip inductor is a conical inductor 1400. The representative conical inductor 1400 is a metal conical inductor that is filled with a ferromagnetic material 1402.

Those skilled in the art will recognize improvements and modifications to the preferred embodiments of the present disclosure. All such improvements and modifications are considered within the scope of the concepts disclosed herein and the claims that follow.

What is claimed is:

1. An amplifier system, comprising:
wideband amplifier circuitry comprising a plurality of transistors in an output stage of an amplifier circuit; and
signal lines operably connected to terminals of the transistors, wherein the signal lines are used in an embedded blocking capacitor structure that operably connects the terminals of the transistors to a radio frequency (RF) output, the embedded blocking capacitor structure comprising at least one metal-insulator-metal capacitor.

2. The amplifier system of claim 1, further comprising a choke circuit operably connected between the embedded blocking capacitor structure and a power source.

3. The amplifier system of claim 2, wherein:
the wideband amplifier circuitry and the embedded blocking capacitor structure are disposed in an integrated circuit; and
the choke circuit is an off-chip choke circuit that is operably connected to the embedded blocking capacitor structure.

4. The amplifier system of claim 3, wherein the choke circuit is a conical inductor.

5. The amplifier system of claim 2, wherein:
the wideband amplifier circuitry and the embedded blocking capacitor structure are disposed in an integrated circuit; and
the choke circuit is an on-chip choke circuit that is operably connected to the embedded blocking capacitor structure.

6. The amplifier system of claim 5, wherein the choke circuit is a planar inductor.

7. The amplifier system of claim 2, wherein an airbridge is used to connect the choke circuit to the embedded blocking capacitor structure.

8. The amplifier system of claim 1, wherein:
each transistor in the plurality of transistors is a field-effect transistor; and the signal lines are microstrip signal lines that operably connect drain terminals of the field-effect transistors to the RF output.

9. The amplifier system of claim 8, wherein a width of a first microstrip line in the microstrip signal lines differs from a width of a second microstrip line in the microstrip signal lines.

10. The amplifier system of claim 1, wherein:
a first signal line is a first conductive plate of the embedded blocking capacitor structure and a second signal line is a second conductive plate of the embedded blocking capacitor structure;
the first conductive plate is operably connected to the choke circuit; and
the second conductive plate is operably connected to an output of the amplifier circuit.

11. A wideband amplifier integrated circuit, comprising:
amplifier circuitry comprising a transistor; and
an embedded blocking capacitor structure operably connecting a terminal of the transistor to a radio frequency (RF) output, the embedded blocking capacitor structure comprising at least one blocking capacitor with a top conductive plate and a bottom conductive plate of the at least one blocking capacitor configured as signal lines.

12. The wideband amplifier integrated circuit of claim 11, further comprising a choke circuit operably connected between the top conductive plate of the embedded blocking capacitor structure and a power source.

13. The wideband amplifier integrated circuit of claim 12, wherein the choke circuit is an off-chip choke circuit that is operably connected to the embedded blocking capacitor structure.

14. The wideband amplifier integrated circuit of claim 13, wherein the off-chip choke circuit is a conical inductor.

15. The wideband amplifier integrated circuit of claim 11, wherein a width of the top conductive plate and a width of the bottom conductive plate are substantially equal along a length of the top conductive plate and a length of the bottom conductive plate.

16. The wideband amplifier integrated circuit of claim 11, wherein an airbridge connects the terminal of the transistor to the embedded blocking capacitor structure.

17. The wideband amplifier integrated circuit of claim 11, wherein:
the top conductive plate is part of a first microstrip signal line that is configured to propagate a direct current voltage to the terminal of the transistor;
the bottom conductive plate is part of a second microstrip signal line that is configured to propagate an RF signal to the RF output; and
a dielectric material is disposed between the top conductive plate and opposing bottom conductive plate.

18. The wideband amplifier integrated circuit of claim 11, wherein a width of the top conductive plate and a width of the bottom conductive plate vary along a length of the top conductive plate and a length of the bottom conductive plate.

19. The wideband amplifier integrated circuit of claim 11, wherein the transistor is a field-effect transistor and the embedded blocking capacitor structure is operably connected to a drain terminal of the field-effect transistor.

20. The wideband amplifier integrated circuit of claim 11, wherein the at least one blocking capacitor comprises multiple blocking capacitors operably connected in parallel and distributed between a starting node of the embedded blocking capacitor structure and the RF output.

* * * * *